United States Patent
Nolas et al.

(10) Patent No.: US 6,188,011 B1
(45) Date of Patent: Feb. 13, 2001

(54) THERMOELECTRIC MATERIALS FABRICATED FROM CLATHRATE COMPOUNDS AND OTHER MATERIALS WHICH FORM AN INCLUSION COMPLEX AND METHOD FOR OPTIMIZING SELECTED THERMOELECTRIC PROPERTIES

(75) Inventors: George S. Nolas, Plano, TX (US); Glen A. Slack, Scotia, NY (US)

(73) Assignee: Marlow Industries, Inc., Dallas, TX (US)

( * ) Notice: Under 35 U.S.C. 154(b), the term of this patent shall be extended for 0 days.

(21) Appl. No.: 09/233,359

(22) Filed: Jan. 18, 1999

Related U.S. Application Data

(60) Provisional application No. 60/071,880, filed on Jan. 20, 1998.

(51) Int. Cl.⁷ ........................................ H01L 35/12
(52) U.S. Cl. .................. 136/236.1; 136/203; 136/236.1; 136/239; 136/240; 136/205
(58) Field of Search ................ 136/205, 236.1, 136/239, 240

(56) References Cited

U.S. PATENT DOCUMENTS

| | | | |
|---|---|---|---|
| 5,064,476 | 11/1991 | Recine, Sr. | 136/201 |
| 5,171,372 | 12/1992 | Recine, Sr. | 136/203 |
| 5,441,576 | 8/1995 | Bierschenk et al. | 136/203 |
| 5,576,512 | 11/1996 | Doke | 136/203 |
| 5,610,366 * | 3/1997 | Fleurial et al. | 136/202 |
| 5,800,794 * | 9/1998 | Tanigaki et al. | 423/324 |

OTHER PUBLICATIONS

"Part 1—The Research Interest BAA 634 Innovative Cryogenic Refrigeration Techniques and Systems Suitable for use with Superconducting Devices," 56 pages, submitted by Marlow Industries to the Naval Research Laboratory on Mar. 26, 1996.

"Technical Proposal: BAA #96–25; PRE–96/25–021, submitted by Marlow Industries, among others, to the Defense Advance Research Projects Agency (DARPA)" in response to part A of BAA96–25, Advanced Thermoelectric Materials and Devices, 53 pages, Sep. 19, 1996.

Crous, et al., English–language translation "On a new family of mineral clathrates isotypic of gas and liguid hydrates. Interpretation of the results obtained" from the Jornal of Solid State Chemistry, vol. 2, pp. 570–581, Jul. 13, 1970.

(List continued on next page.)

Primary Examiner—Kathryn Gorgos
Assistant Examiner—Thomas H Parsons
(74) Attorney, Agent, or Firm—Baker Botts, L.L.P.

(57) ABSTRACT

The present invention allows optimum filling of cavities or cages typically found in crystal lattice type structures associated with an inclusion complex such as formed by clathrate compounds. Filling such cavities or cages in the associated crystal lattice type structure provides semiconductor materials which are particularly beneficial for use in fabricating thermoelectric devices for electrical power generation and/or cooling applications. By filling the cavities or cages associated with clathrate compounds with selected metal and/or semi-metal atoms, reductions in thermal conductivity may be optimized while at the same time minimizing any reduction in electrical properties of the resulting semiconductor materials. As a result, the thermoelectric Figure of Merit for a thermoelectric device fabricated from such clathrate compounds is maximized. The present invention allows optimizing both the size and type of atoms used to fill cavities or cages in an inclusion complex and to optimize the ratio between a first group of inclusion atoms and a second group of inclusion atoms used to fill such cavities or cages to maximize the thermoelectric Figure of Merit for the resulting thermoelectric device.

26 Claims, 6 Drawing Sheets

OTHER PUBLICATIONS

Glen A. Slack, "New Materials and Performance Limits for Thermoelectric Cooling", *Rensselaer Polytechnic Institute*, Troy, New York, U.S.A., pp. 407–440, No month provided 1995.

Glen A. Slack, "Design Concepts for Improved Thermoelectric Materials", *Materials Research Society Symposium Proceedings vol. 478*, pp. 47–55 (Thermoelectric Materials—New Directions and Approaches). No month provided 1997.

Christian Cros, "Sur.quelques nouveaux siliciures et germaniures alcalins à structure clathrate: étude cristallochimioue et physique", *Thése, A La Faculté Des Sciences De L'université de Bordeau*, May 8, 1970.

"Thermoelectric Materials: New Approaches to an Old Problem" *Physics Today* ©Mar. 1997 American Institute of Physics, S–0031–9228–9703–030–5.

* cited by examiner

THERMOELECTRIC MATERIALS FABRICATED FROM CLATHRATE COMPOUNDS AND OTHER MATERIALS WHICH FORM AN INCLUSION COMPLEX AND METHOD FOR OPTIMIZING SELECTED THERMOELECTRIC PROPERTIES

RELATED APPLICATIONS

This application claims the benefit of provisional patent application, Serial No. 60/071,880, filed Jan. 20, 1998 having the same title.

BACKGROUND OF THE INVENTION

1. Field of the Invention

This invention relates to the design and preparation of semiconductor materials from materials which form an inclusion complex such as a clathrate compound or a zeolite having a crystal lattice type structure and more specifically filling cavities or cages associated with the crystal lattice type structure with selected atoms to enhance various thermoelectric properties of the semiconductor materials.

2. Description of the Related Art

The basic theory and operation of thermoelectric devices has been developed for many years. Presently available thermoelectric devices used for cooling typically include an array of thermocouples which operate in accordance with the Peltier effect. Thermoelectric devices may also be used for heating, power generation and temperature sensing.

Thermoelectric devices may be described as essentially small heat pumps which follow the laws of thermodynamics in the same manner as mechanical heat pumps, refrigerators, or any other apparatus used to transfer heat energy. A principal difference is that thermoelectric devices function with solid state electrical components (thermoelectric elements or thermocouples) as compared to more traditional mechanical/fluid heating and cooling components. The efficiency of a thermoelectric device is generally limited to its associated Carnot cycle efficiency reduced by a factor which is dependent upon the thermoelectric Figure of Merit (ZT) of materials used in fabrication of the associated thermoelectric elements. Materials used to fabricate other components such as electrical connections, hot plates and cold plates may also affect the overall efficiency of the resulting thermoelectric device.

The thermoelectric Figure of Merit (ZT) is a dimensionless measure of the effectiveness of a thermoelectric device and is related to material properties by the following equation:

$$ZT = S^2 \sigma T / \kappa \quad (1)$$

where S,σ,κ, and T are the Seebeck coefficient, electrical conductivity, thermal conductivity and absolute temperature, respectively. The Seebeck coefficient (S) is a measure of how readily the respective carriers (electrons or holes) can transfer energy as they move through a thermoelectric element which is subjected to a temperature gradient. The type of carrier (electron or hole) is a function of the materials selected to form each thermoelectric element.

The electrical properties (sometimes referred to as electrical characteristics, electronic properties, or electronic characteristics) associated with materials used to form thermoelectric elements may be represented by $S^2\sigma$. Many of the materials which are used to form thermoelectric elements may be generally described as semiconductor compounds or semiconductor materials. The thermoelectric Figure of Merit is also related to the strength of interactions between the carriers and vibrations of the crystal lattice structure associated with semiconductor materials and available carrier energy states. Such vibrations may sometimes be referred to as "phonons".

Both the crystal lattice structure and the carrier energy states are a function of the materials selected to form each thermoelectric device. As a result, thermal conductivity (κ) is a function of both an electronic component ($\kappa_e$) primarily associated with the respective carriers and a lattice component ($\kappa_g$) primarily associated with the respective crystal lattice structure and propagation of phonons through the respective crystal lattice structure. In general, thermal conductivity may be stated by the equation:

$$\kappa = e\kappa_e + \kappa_g \quad (2)$$

The thermoelectric Figure of Merit (ZT) may also be stated by the equation:

$$ZT = \frac{S^2 T}{\rho \kappa} \quad (3)$$

$\rho$ = electrical resistivity $\sigma$ = electrical conductivity electrical conductivity = $\frac{1}{\text{electrical resistivity}}$ or $\sigma = \frac{1}{\rho}$ Thermoelectric materials such as alloys of $Bi_2Te_3$, PbTe and BiSb were developed thirty to forty years ago. The lattice component of thermal conductivity ($K_g$) for such materials was reduced by forming a mixed crystal lattice type structure. More recently, semiconductor materials such as SiGe have been used in the fabrication of thermoelectric devices. Commercially available thermoelectric materials are generally limited to use in a temperature range between 300° K. and 1300° K. with a maximum ZT value of approximately one. The efficiency of such thermoelectric devices remains relatively low at approximately five to eight percent (5–8%) energy conversion efficiency. For the temperature range of –100° C. to 1000° C., maximum ZT for many state of the art thermoelectric materials also remains limited to values of approximately 1, except for Te-Ag-Ge-Sb alloys (TAGS) which may achieve a ZT of 1.2 to 1.4 in a relatively narrow temperature range. Recently developed materials such as $Si_{80}Ge_{20}$ alloys used in thermoelectric generators to power spacecrafts for deep space missions have an average thermoelectric Figure of Merit approximately equal to 0.5 from 300° C. to 1,000° C.

An inclusion complex may be described as an unbonded association of a first material component and a second material component in which atoms of the first material component form a complex structure with cavities or cages. Atoms or molecules of the second material component are either wholly or partially trapped within the cavities or cages formed by the first material component. There are several types of inclusion complexes, including clathrates and zeolites. A typical clathrate compound such as $3C_6H_4(OH)_2 \cdot SO_2$ may be depicted as:

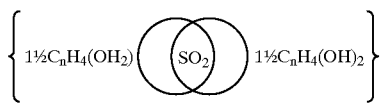

(4)

where the interlocked rings represent mutual enclosures of two cages. The formula for any clathrate compound is determined in part by the ratio of available cavities or cages to the amount of cage material.

Zeolite compounds may be described as a hydrated silicate of aluminum and either sodium or calcium or both, having a general formula of $Na_2O \cdot Al_2O_3 \cdot xSiO_2 \cdot xH_2O$. Potassium compounds may also be present in zeolites. Both natural and artificial zeolites are used extensively for water softening, as detergent builders, and petroleum cracking catalysts. Natural zeolites include analcite, chabazite, heulandite, natrolite, stilbite, and thomosonite. Synthetic zeolites may be made by a gel process (sodium silicate and alumina) or a clay process (kaolin). The effectiveness of zeolites as a catalyst or filter will often depend upon the pore size, which may be as small as four to five angstroms. Other applications for zeolites include adsorbents, desiccants, and solar collectors, where zeolites may function as both heating and cooling agents.

Materials which form an inclusion complex have previously been used to separate molecules of different shapes, e.g., straight-chain hydrocarbons from those containing side chains, as well as structural isomers. Inclusion complex materials have also been used as templates for directing chemical reactions. Also, a wide variety of clathrate hydrates have previously been studied in which water ($H_2O$) (first material component of the inclusion complex) forms complex ice crystals with various atoms or molecules (second material component of the inclusion complex) trapped in the ice crystals.

Some disordered crystalline dielectric materials possess very low values of thermal conductivity ($\kappa$) over a large temperature range, similar to the thermal conductivity of amorphous solids. These materials are known to have a number of common characteristics. For example, the presence of atoms or molecular groups having two or more semi-stable positions, and the absence of long-range correlation between their positions or orientations. The relationship between glass-like values of thermal conductivity ($\kappa$) and the theoretical minimum thermal conductivity ($\kappa_{min}$) is also known.

Various clathrate compounds and techniques for fabricating $Me_8X_{46}$ and $Me_{24}X_{136}$ with X=Si of Ge clathrate compounds are disclosed in a 1970 thesis entitled "Sur Quelques Nouveaux Siliciures et Germaniures Alcalins a Structure Clathrate: Etude Crystallochimique et Physique" by Christian Cross, University of Bordeaux, Bordeaux, France.

SUMMARY OF THE INVENTION

In accordance with teachings of the present invention, clathrate compounds and other materials which form an inclusion complex may be used to provide semiconductor materials for fabrication of thermoelectric devices having substantially enhanced operating efficiency. Clathrate compounds formed in accordance with teachings of the present invention have demonstrated relatively high carrier mobility characteristic of a good semiconductor material and relatively low thermal conductivity characteristic of a good thermoelectric material. As a result, such clathrate compounds may provide semiconductor materials with a thermoelectric Figure of Merit substantially greater than presently available from existing materials used to fabricate thermoelectric devices.

Technical advantages of the present invention include the ability to obtain increased efficiency from a thermoelectric device having one or more thermoelectric elements fabricated in part from materials which form an inclusion complex with crystal lattice type structures modified to optimize selected thermoelectric characteristics of the resulting thermoelectric device. A significant reduction in thermal conductivity ($\kappa$) may be achieved by filling the cavities or cages associated with selected clathrate compounds in accordance with teachings of the present invention. By selecting the atoms and/or molecules which will be used to fill cavities or cages typically associated with clathrate compounds in accordance with teachings of the present invention, phonon propagation through the resulting crystal lattice type structure may be significantly affected to reduce thermal conductivity ($\kappa$) while at the same time minimizing any reduction in electrical properties ($S^2\sigma$) of the resulting semiconductor materials. Examples of clathrate compounds which may be satisfactory for use with the present invention include, but are not limited to Si, Ge and Sn-clathrates. Typical formulas for such clathrate compounds include $Ne_8Y_{16}E_{30}$, $Me_8Z_8E_{38}$, $Me_8E_{46}$, $Me_{24}E_{136}$ and alloys of these compounds where Me represents alkali metal (Group 1) atoms such as sodium (Na) and potassium (K), Ne represents alkaline earth (Group 2) atoms such as strontium (Sr) and barium (Ba), Y represents Group 13 atoms such as gallium (Ga), Z represents Group 12 atoms such as zinc (Zn) and E represents Group 14 atoms such as silicon (Si), germanium (Ge) and tin (Sn).

In accordance with one aspect of the present invention, cavities or cages typically associated with an inclusion complex may be filled with metal or semi-metal atoms (sometimes referred to as "inclusion atoms") to optimize the reduction in thermal conductivity of the resulting crystal lattice type structure while at the same time minimizing any reduction in electrical properties which will maximize the thermoelectric Figure of Merit for the resulting thermoelectric device. Teachings of the present invention allow selecting appropriately sized atoms of two or more different metals or semi-metals with respective electrical characteristics that minimize any reduction in electrical properties, while at the same time filling the cavities or cages to optimize reduction of thermal conductivity. For some applications a first number of the cavities or cages may be filled with a first group of inclusion atoms and a second number of the cavities or cages may be filled with a second group of inclusion atoms. The ratio of the first group of inclusion atoms with respect to the second group of inclusion atoms may be varied to produce desired electrical and thermoelectric characteristics.

Clathrate compounds having crystal lattice type structures with the associated cavities or cages filled in accordance with teachings of the present invention have demonstrated over-an-order of magnitude decrease in thermal conductivity ($\kappa$) measured at room temperature as compared to Si or Ge crystals. Both N-type and P-type semiconductor materials may be fabricated from clathrate compounds having their associated cavities or cages filled with selected metal or semi-metal atoms. Thermoelectric devices with thermoelectric elements formed in part from such clathrate compounds may have substantially enhanced thermoelectric operating characteristics and improved efficiency as compared to previous thermoelectric devices. Such thermoelectric devices may be used for cooling, heating, electrical power generation and temperature sensing.

Various embodiments of the present invention have been reduced to practice and selected tests have been performed to demonstrate the principles and concepts associated with the present invention. A comparison of presently available data for ice and ice-clathrates reveals a decrease in thermal conductivity ($\kappa$) as the mass (size) of the atoms (second material component) trapped in the ice crystals increases (decreases). Apparently, the more room that massive atoms of the second material component have to "rattle" in respective cages formed by the ice crystals (first material component), the larger the reduction in thermal conductivity ($\kappa$). For some clathrate hydrates with xenon (Xe) atoms (the second material component), the resulting value thermal conductivity ($\kappa$) is even lower than the thermal conductivity ($\kappa$) of water. A "rattling" motion associated with atoms selected in accordance with teachings of the present invention to fill cavities or cages in clathrate compounds may have a substantial influence on reducing thermal conductivity ($\kappa$) of the resulting semiconductor material.

Filling a first portion of the cavities or cages with inclusion atoms of a first metal or semi-metal and filling a second portion of the cavities or cages with inclusion atoms of a second metal or semi-metal with appropriate charge compensation in accordance with teachings of the present invention may result in lower carrier concentrations and less scattering of the carriers when subjected to both a temperature gradient and a difference in DC voltage as compared to previous semiconductor materials used to fabricate thermoelectric devices. By compensating for the charge atom(s) disposed within the cages of a clathrate compound, in accordance with teachings of the present invention, the resulting materials have desired characteristics of a good semiconductor as compared to metal compounds.

Cavity or cage filling of an inclusion complex with selected metal and semi-metal atoms may improve other characteristics in addition to thermoelectric properties. Further embodiments of the present invention include other material systems with a crystal lattice type structure having cavities or cages and electrical properties which may be improved by filling the cavities or cages in accordance with teachings of the present invention.

The present invention teaches forming an inclusion complex with selected inclusion atoms filling relatively large cavities or cages in the inclusion complex such that the inclusion atoms are free to move independently within respective cavities or cages. Movement or rattling of the selected atoms within their respective cages produces short range disorder, resulting in a low lattice component of thermal conductivity ($\kappa_g$) and an overall reduction in thermal conductivity ($\kappa$) of materials forming the inclusion complex. Some of the effects of introducing selected atoms or molecules into "cages" in a crystal lattice type structure have been demonstrated by clathrate hydrates. An important aspect of the present invention includes recognizing that analogous effects may occur in Si, Ge and Sn-clathrate systems.

One aspect of the present invention includes selecting materials to form an inclusion complex with a crystal lattice type structure having a value of thermal conductivity that approaches the thermal conductivity of amorphous silicon dioxide or glass, and provides desired electronic properties normally associated with a single crystal semiconductor material. The present invention allows fabrication of semiconductor materials that have characteristics of a phonon glass and an electron crystal.

Another aspect of the present invention includes modifying the transport properties of semiconducting compounds with a type-I clathrate hydrate structure in order to maximize the desired electrical properties ($S^2\sigma$).

BRIEF DESCRIPTION OF THE DRAWINGS

For a more complete understanding of the present invention and its advantages, reference is now made to the following description taken in conjunction with the accompanying drawings in which.

DETAILED DESCRIPTION OF THE INVENTION

The preferred embodiments of the present invention and its advantages are best understood by reference to FIGS. 1 through 12 of the drawings, like numerals being used for like and corresponding parts in the various drawings.

Figure 1:
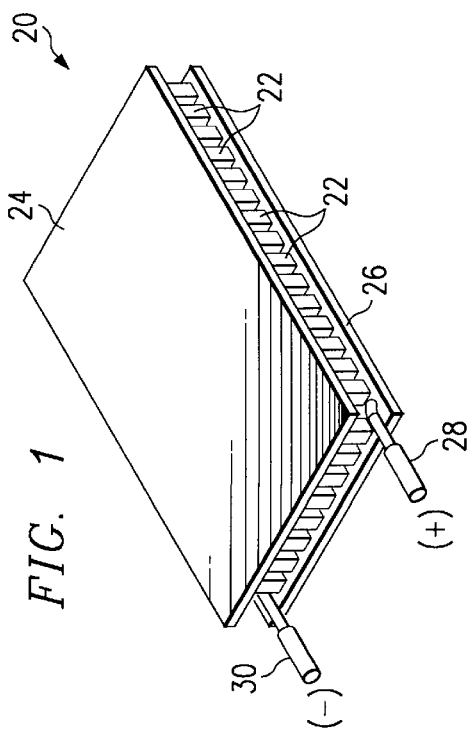
FIG. 1 is a schematic drawing showing an isometric view of one type of thermoelectric device having multiple thermoelectric elements which may be fabricated from materials which form an inclusion complex having a crystal lattice type structure incorporating teachings of the present invention.
Figure 2:
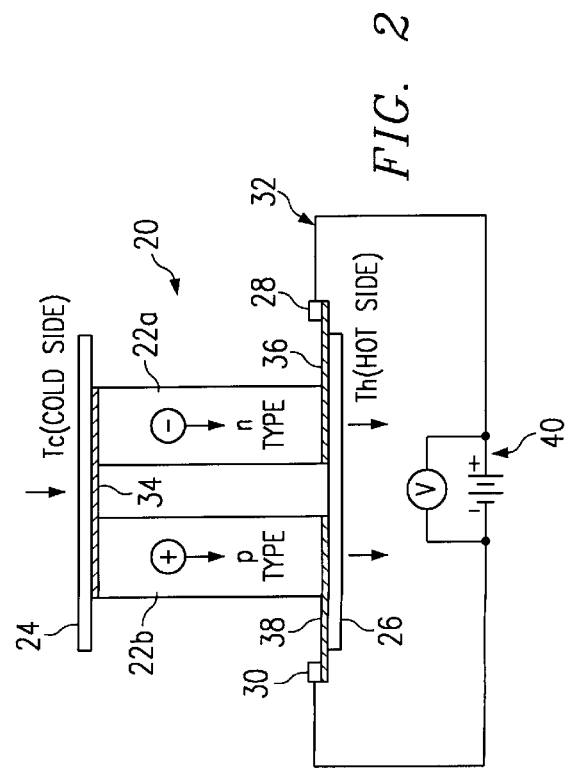
FIG. 2 is an electrical schematic drawing of the thermoelectric device of FIG. 1.

Thermoelectric device 20, as shown in FIGS. 1 and 2, may be manufactured in part from materials such as clathrate compounds or zeolites which form an inclusion complex having a crystal lattice type structure fabricated in accordance with teachings of the present invention. Selective filling of cavities or cages associated with the crystal lattice type structure allows optimization of various desired thermoelectric characteristics depending upon the intended use of the resulting thermoelectric device 20.

Thermoelectric device 20 may be used as a heater, cooler, electrical power generator and/or temperature sensor. Thermoelectric device 20 is an example of only one of many different type of thermoelectric devices which may be manufactured from materials having a crystal lattice structure formed in accordance with teachings of the present invention. The thermoelectric Figure of Merit (ZT) of thermoelectric device 20 will vary depending upon the type of use. For example thermoelectric device 20 may have a first value of ZT when used as a cooler and a second, different value of ZT when used as an electrical power generator. One of the technical benefits of the present invention includes selective filling of cavities or cages of an inclusion complex with metal and/or semi-metal atoms to optimize performance of thermoelectric device 20 depending upon its intended use.

Thermoelectric device 20 is preferably manufactured with a plurality of thermoelectric elements (sometimes referred to as "thermocouples") 22 disposed between cold plate 24 and hot plate 26. Electrical connections 28 and 30 are provided to allow attaching thermoelectric device 20 to an appropriate source of DC electrical power. If thermoelectric device 20 were designed to function as an electrical power generator, electrical connections 28 and 30 would represent the output terminals from such a power generator operating between hot and cold temperature sources (not expressly shown).

FIG. 2 is a schematic representation of electrical circuit 32 which is typical for a single stage thermoelectric device such as thermoelectric device 20. Electrical circuit 32 is also typical of electrical circuits associated with using thermoelectric elements or thermocouples to convert heat energy into electrical energy. Electrical circuit 32 generally includes two or more thermoelectric elements 22 fabricated from dissimilar semiconductor materials such as N-type thermoelectric element 22a and P-type thermoelectric elements 22b. Thermoelectric elements 22 are typically arranged in an alternating N-type element to P-type element configuration. In many thermoelectric devices, thermoelectric elements 22 with dissimilar electrical characteristics are connected electrically in series and thermally in parallel.

Examples of thermoelectric devices and methods of fabrication are shown in U.S. Pat. No. 5,064,476 entitled *Thermoelectric Cooler and Fabrication Method*; U.S. Pat. No. 5,171,372 entitled *Thermoelectric Cooler and Fabrication Method*; U.S. Pat. No. 5,441,576 entitled *Thermoelectric Cooler*; and U.S. Pat. No. 5,576,512 entitled *Thermoelectric Apparatus for Use With Multiple Power Sources and Method of Operation*.

N-type semiconductor materials generally have more electrons than necessary to complete the associated crystal lattice structure. P-type semiconductor materials generally have fewer electrons than necessary to complete the associated crystal lattice structure. The "missing electrons" are sometimes referred to as "holes." The extra electrons or extra holes associated with typical semiconductor materials are sometimes referred to as "carriers" because the electrons or holes are generally responsible for transporting electrical current through the respective semiconductor material. The extra electrons in N-type semiconductor materials and the extra holes in P-type semiconductor materials may also function as agents or carriers which transport or move heat energy between cold side or cold plate 24 and hot side or hot plate 26 through thermoelectric elements 22 when subject to a DC voltage potential. These same agents or carriers may generate electrical power when an appropriate temperature difference is present between cold side 24 and hot side 26.

Vibrations of a crystal lattice type structure (sometimes referred to as "phonons") associated with N-type and P-type semiconductor materials may also cooperate with the respective carriers to transport or move heat energy through thermoelectric elements 22a and 22b. As discussed later in more detail, the phonons may adversely effect some of the electrical properties associated with the respective carriers. Ceramic materials are frequently used to manufacture plates 24 and 26 which define in part the cold side and hot side, respectively, of thermoelectric device 20.

In thermoelectric device 20, alternating thermoelectric elements 22a and 22b of N-type and P-type semiconductor materials may have their ends connected in a serpentine fashion by electrical conductors such as 34, 36 and 38. Conductors 34, 36 and 38 are typically metallizations formed on the interior surfaces of plates 24 and 26. Commercially available thermoelectric devices which function as a cooler generally include two ceramic plates with P-type and N-type elements formed from bismuth telluride (BiTe) alloys disposed between the ceramic plates and electrically connected with each other.

When DC electrical power from power supply 40 is properly applied to thermoelectric device 20, heat energy will be absorbed on cold side 24 of thermoelectric device 20. The heat energy will pass through thermoelectric elements 22 and will be dissipated on hot side 26 of thermoelectric device 20. A heat sink (sometimes referred to as a "hot sink", not shown) may be attached to hot plate 26 of thermoelectric device 20 to aid in dissipating heat transferred by the associated carriers and phonons through thermoelectric elements 22 to the adjacent environment. In a similar manner a heat sink (sometimes referred to as a "cold sink", not shown) may be attached to cold side 24 of thermoelectric device 20 to aid in removing heat from the adjacent environment. Thus, thermoelectric device 20 may sometimes function as a thermoelectric cooler when properly connected with power supply 40. However, since thermoelectric devices are a type of heat pump, thermoelectric device 20 may also function as a heater, power generator, or temperature sensor.

Many crystalline materials with low thermal conductivity do not have good electrical conductivity and many crystalline materials with good electrical conductivity often have relatively high values of thermal conductivity. For example, many binary semiconductor compounds have relatively good electrical properties. However, the value of thermal conductivity associated with such binary semiconductor compounds is generally relatively large which often results in a thermoelectric Figure of Merit less than desired. Covalent bonding associated with many binary semiconductor compounds is often responsible for the large value of thermal conductivity.

Figure 3:
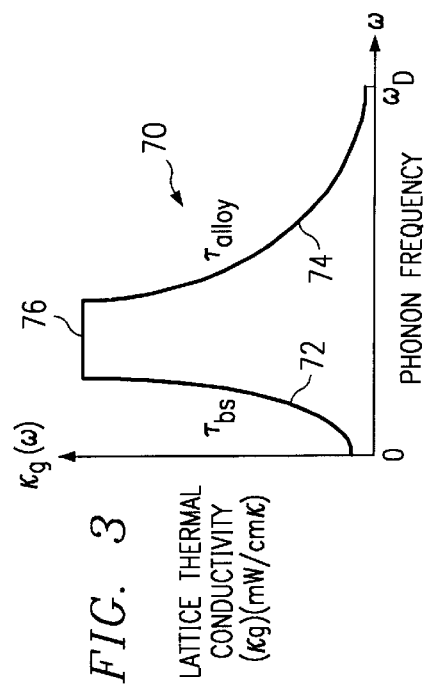
FIG. 3 is a schematic representation of the lattice component of thermal conductivity ($\kappa_g$) versus phonon frequency ($\omega$)

Various techniques have previously been used in an attempt to reduce the lattice component of thermal conductivity ($\kappa_g$) in a crystal lattice type structure typically associated with semiconductor materials. Alloy scattering and grain boundary scattering represent some of these techniques for increasing phonon-scattering in crystal lattice type structures. However, many of the previously used phonon-scattering techniques have only been effective in a particular phonon energy range while interacting relatively weakly with phonons outside the limited energy range. Line 70 shown in FIG. 3 is a typical graphical representation of the effects of alloy scattering and grain boundary scattering in a typical binary semiconductor compound.

Portion 72 of the line 70 represents a decrease in the lattice component of thermal conductivity ($\kappa_g$) associated with grain boundary scattering at relatively low phonon frequencies. Portion 74 of the line 70 represents a decrease in the lattice component of thermal conductivity due to alloy scattering at relatively high phonon frequencies. However, portion 76 of the line 70 shown in FIG. 3 indicates that a substantial portion of the phonon frequency range has not been effected by either grain boundary scattering or alloy scattering.

Figure 4:
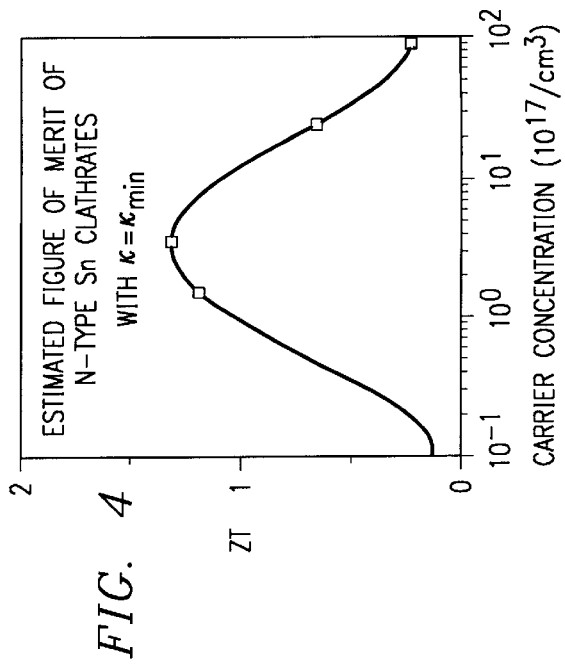
FIG. 4 is a graphical representation of the estimated thermoelectric Figure of Merit (ZT) of an N-type clathrate compound having tin (Sn) atoms which form the desired crystal lattice type structure with atoms selected in accordance with teachings of the present invention to fill large cavities or cages formed in the crystal lattice type structure.

FIG. 4 is a graphical representation of the estimated thermoelectric Figure of Merit (ZT) for N-type semiconductor materials formed from tin (Sn) clathrate compounds at room temperature. Calculations used to prepare this estimate were based on using Sn atoms as the first material component of the inclusion complex. The first material component may from time to time be referred to as the "lattice atoms." The calculations were also based on placing metal or semi-metal atoms as the second material component to fill relatively large cavities or cages in the crystal lattice type structure associated with the inclusion complex formed by the Sn atoms. The second material component may from time to time be referred to as the "inclusion atoms."

Literature data of crystalline N-type GaAs crystals at different carrier concentrations were used to calculate estimated values of $S^2\sigma$ for the semiconductor materials. The value of thermal conductivity ($\kappa$) was assumed to be equal to the theoretical minimum value of thermal conductivity ($\kappa_{min}$) for tin (Sn). These preliminary calculations demonstrate that Sn clathrate compounds having cavities or cages filled with inclusion atoms selected in accordance with teachings of the present invention may be used to fabricate thermoelectric elements with a thermoelectric Figure of Merit equal to or better than semiconductor materials presently used to fabricate thermoelectric elements.

Figure 5:
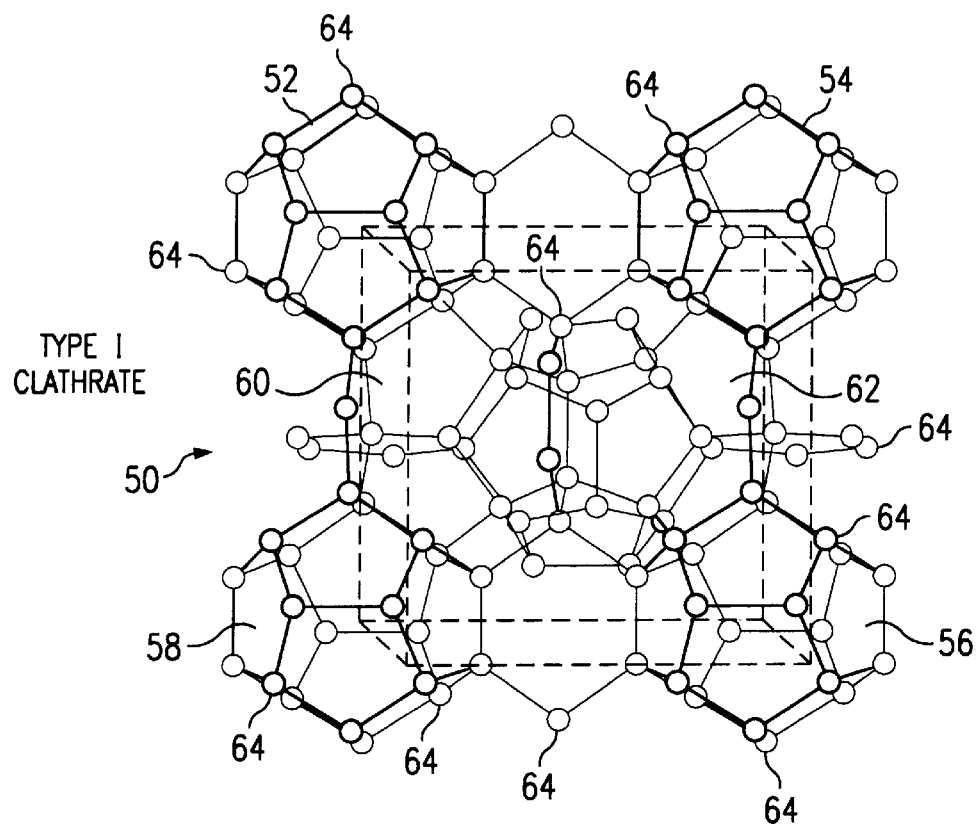
FIG. 5 is a schematic representation of a unit cell for a clathrate compound having a typical type-I clathrate hydrate crystal lattice type structure with relatively large cavities or cages which may be filled in accordance with teachings of the present invention.
Figure 6:
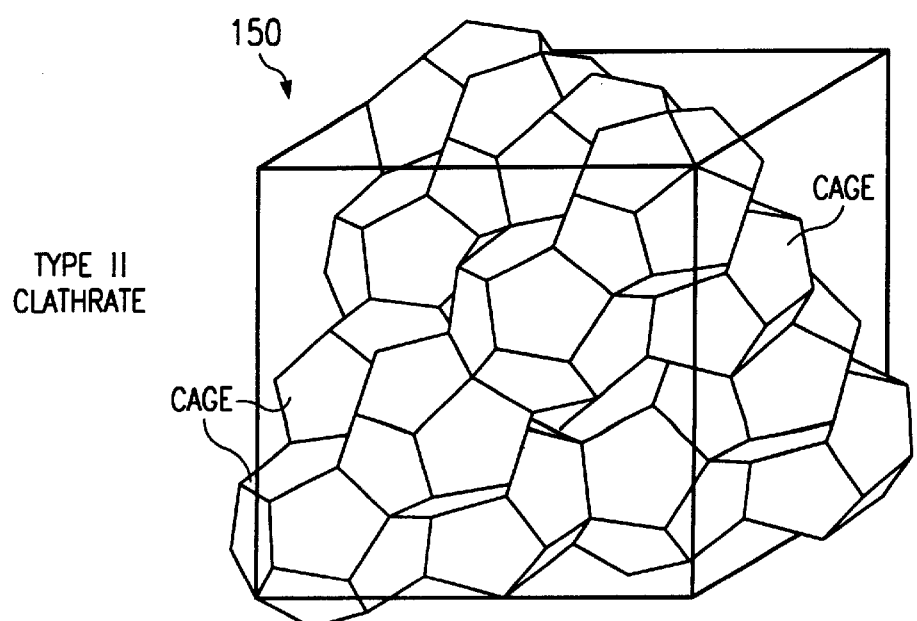
FIG. 6 is an isometric drawing showing a schematic representation of a unit cell for a clathrate compound having a typical type-II clathrate hydrate crystal lattice type structure with relatively large cavities or cages which may be filled in accordance with teachings of the present invention.

Various materials which form an inclusion complex such as clathrate compounds and zeolites may be prepared in accordance with teachings of the present invention to provide semiconductor materials with crystal lattice type structures such as represented by unit cell 50 shown in FIG. 5 or unit cell 150 shown in FIG. 6. Both single crystal and polycrystalline versions of semiconductor materials having crystal lattice type structures such as represented by unit cells 50 and 150 may be fabricated in accordance with teachings of the present invention. Clathrate compounds with unit cells such as unit cells 50 and 150 shown in FIG. 5 and 6 were previously discussed in the thesis of Christian Cross. See Background of the Invention.

Clathrate compounds formed in accordance with teachings of the present invention preferably have complex crystal lattice type structures formed by atoms of a first material component with relatively large cavities or cages disposed therein. Unit cell 50 as shown in FIG. 5 is representative of a crystal lattice type structure typically associated with a type-I clathrate hydrate. Unit cell 150 as shown in FIG. 6 is representative of a crystal lattice type structure typically associated with a type-II clathrate hydrate. Specific dimensions, configuration and orientation of unit cells 50 and 150 for each crystal lattice type structure will vary depending upon the atoms selected as the first material component and the atoms or molecules selected as the second material component.

Unit cell 50 for clathrate compounds formed in accordance with teachings of the present invention will generally have eight metal atoms and forty-six semi-metal and/or nonmetal atoms. Unit cell 150 for clathrate compounds formed in accordance with teachings of the present invention will generally have between three and twenty-four metal atoms and one hundred thirty-six semi-metal and/or nonmetal atoms. Clathrate compounds represented by unit cell 50 may be described by general formulas such as $Ne_8Y_{16}E_{30}$, $Me_8Z_8E_{38}$ and $Me_8E_{46}$. Clathrate compounds represented by unit cell 150 may be described by the general formula $Me_xE_{136}$. In these general formulas Ne may be Ca, Sr, or Ba; Y may be Al, Ga, or In; Z may be Zn or Cd; Me may be Na, K, Rb, or Cs and E may be Ge, Si or Sn, with $3 \leq x \leq 24$. These Ge, Si, and Sn-clathrates have crystal lattice type structures very similar to unit cells 50 and 150. Unit cells 50 and 150 may be described as tetrahedral networks with periodic cavities or cages of E-polyhedra.

For purposes of describing various features of the present invention, "Me" will be used in formulas to represent alkali metal atom. "Ne" will be used in formulas to represent alkaline earth atoms. "M" will be used in formulas to represent alkali metal atoms, alkaline earth atoms and europium.

Unit cell 50 includes two subcells of similar type as subcells 52, 54, 56 and 58 and four larger subcells similar to subcells 60 and 62. Atomic crystallographic sites 64 are preferably occupied by atoms of the first material component which defines unit cell 50 and subcells 52, 54, 56, 58, 60 and 62. Subcells 52, 54, 56, 58, 60 and 62 may also be described as cages or cavities because a loose atom or molecule may be interstitially disposed within each cage or activity without forming a metallurgic bond with the atoms occupying the adjacent crystallographic sites 64. Thus, metal atoms respectively placed within cages 52, 54, 56, 58, 60 and 62 may be described as "loose" or free to rattle within their respective cage or cavity. As a result, the lattice component of thermal conductivity ($\kappa_g$) of the crystal lattice structure may be substantially reduced.

By selecting the inclusion atoms used to fill cages 52, 54, 56, 58, 60 and 62 in accordance with teachings of the present invention, the lattice component of thermal conductivity may be reduced to very low values similar to amorphous solids such as a glass represented by amorphous silica or a-SiO$_2$. Placing appropriately selected inclusion atoms within cages 52, 54, 56, 58, 60 and 62 is also effective in reducing the lattice component of thermal conductivity ($\kappa_g$) over a relatively large temperature range.

Atomic crystallographic sites 64 may be occupied by various semi-metal atoms such as silicon (Si), tin (Sn), germanium (Ge), phosphorus (P), gallium (Ga), zinc (Zn), cadmium (Cd), indium (In), arsenic (As), antimony (Sb) and tellurium (Te). Cavities or cages 52, 54, 56, 58, 60 and 60 may be filled by atoms of a second material component such as Na, K, Rb, Cs, Ca, Sr, Ba and Eu. The "inclusion atoms", or atoms of a second material component, filling cages 52, 54, 56, 58, 60 and 62 preferably having a total mass per unit cell of at least 3% of the total mass of each unit cell.

Complex crystal lattice structures with relatively large cages or cavities such as represented by unit cells 50 and 150 are formed by atoms of a first material component trapping atoms or molecules of a second material component within the respective cages or cavities. A typical inclusion complex will generally have all of the cavities or cages formed in the associated crystal lattice structure filled by atoms or molecules of the second material component. If the atoms or molecules of the second material component are not present, the atoms of the first material component will typically form a substantially different type of crystal lattice structure which does not include relatively large cavities or cages. By selecting the second material component used to form the complex crystal lattice structure, the thermal conductivity of these semiconductor clathrate material may be reduced by a factor of ten (10) or greater as compared to germanium (Ge) or silicon (Si).

In theory, the lowest value of thermal conductivity associated with semiconductor material such as silicon (Si) and germanium (Ge) will occur when these semiconductor materials are in an amorphous, non-crystalline form. Generally, thermal conductivity of semiconductor material such as silicon (Si) and germanium (Ge) will increase with increased regularity of the associated crystal lattice structure. Filling the cages or cavities of the crystal lattice structure with atoms selected in accordance with teachings of the present invention will reduce the lattice component of thermal conductivity ($\kappa_g$) to approximately the minimum value of thermal conductivity ($\kappa_g$) associated with an amorphous compound of the first material component forming the lattice structure. This reduction in thermal conductivity may be accomplished while good electronic properties of the resulting semiconductor materials are maintained.

Alkali metal (Group 1), alkaline-earth (Group 2) and rare-earth atoms typically do not enter the lattice structure substitutionally but are interstitial, residing in the cages. Each Si atom, for example, forms bonds to other Si atoms in a distorted tetrahedral arrangement. The Si—Si bond distances, however, are approximately the same as in the ordinary diamond structure. The polyhedra are covalently bonded to each other by shared faces. Chemically, such clathrate compounds are unreactive to air and moisture despite their relatively high alkali content, as opposed to NaSi for example. The chemical properties of Si clathrate compounds are similar to those of ordinary silicon.

Figure 7:
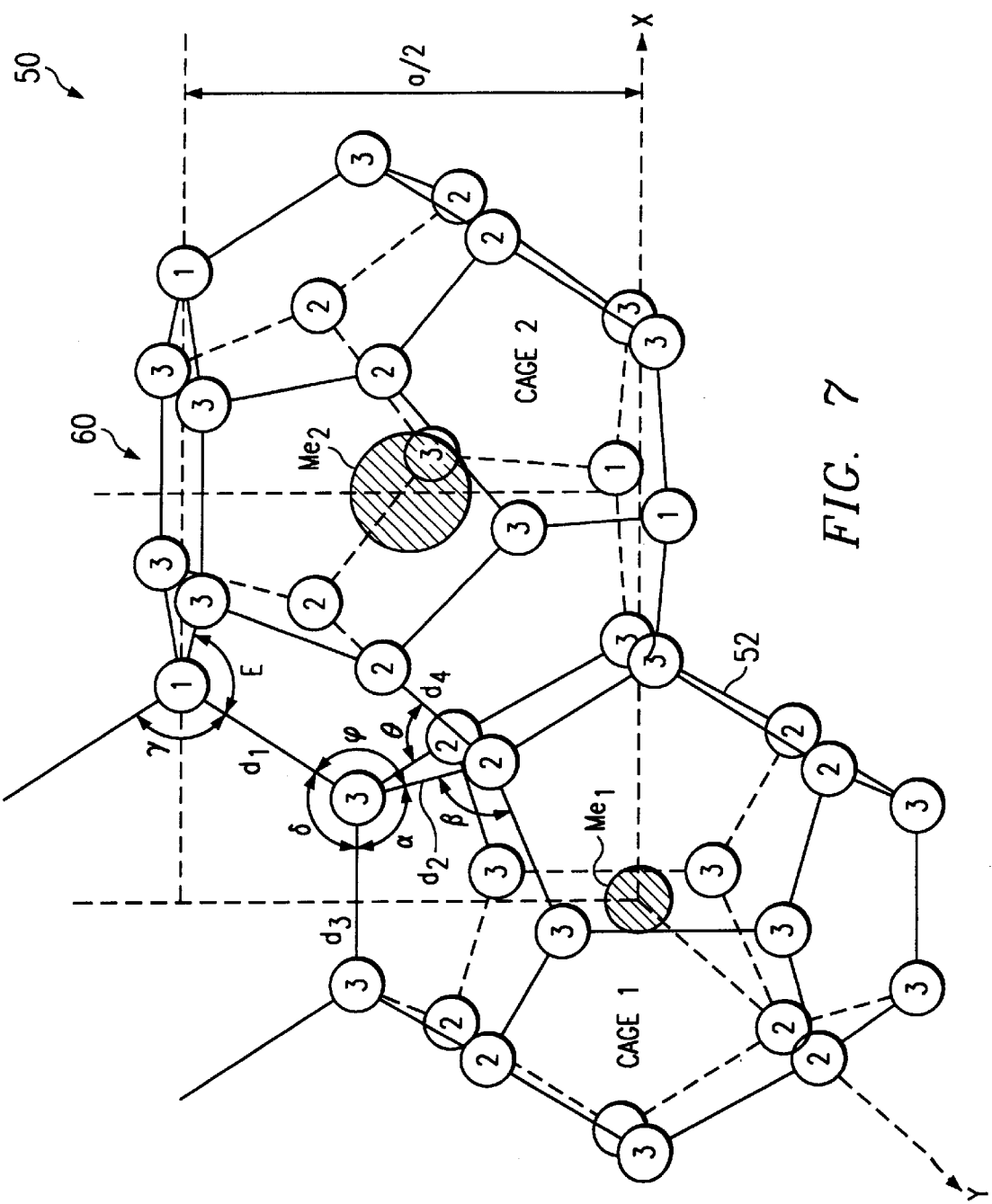
FIG. 7 is a more detailed schematic representation of a portion of the unit cell of the clathrate compound of FIG. 5, including atomic crystallographic sites which define in part the crystal lattice type structure and the relatively large cavities or cages.

FIG. 7 shows a more detailed schematic representation of unit cell 50 formed from a type I clathrate compound having the general formula $Sr_8Ga_{16}Ge_{30}$. For this embodiment of the present invention as shown in FIG. 7, Sr atoms are preferably disposed at crystallographic sites designated Me$_1$ and Me$_2$ in respective cages 52 and 60. Ga atoms and Ge atoms are generally randomly distributed at crystallographic sites designated 1, 2 and 3 in FIG. 7. The bond distances were obtained from Riedvelt analysis of x-ray diffraction data from a $Sr_8Ga_{16}Ge_{30}$ sample with the type-I clathrate crystal lattice structure. Cage 52 which may also be described as a dodecahedron with the following bond lengths:

Sr1-3≈3.561 angstroms and
Sr1-2≈3.442 angstroms. Cage 60 which may also be described as a tetrakaidecahedron with the following bond lengths:

Sr2-1≈3.795 angstroms;
Sr2-3≈3.593 angstroms;
Sr2-2≈3.982 angstroms; and
Sr2-3≈4.165 angstroms.

In the case of $Me_8E_{46}$ (type I) clathrate compounds, for example, the centers of all polyhedra are occupied by alkali atoms. The structure is of space group Pm3n. The "caged" alkali atoms are in 2a and 6d crystallographic positions with 20 and 24 coordination (i.e. 20 and 24 Si atoms surround the Me atom), respectively. These compounds are metallic and their structure is analogous to the 46 H$_2$O·8M type-I hydrate structure (M being the inclusion atom or molecule).

In the case of the $Me_xE_{136}$ (type II) clathrate compounds, there occurs only partial occupancy of the polyhedral cages. The structure type is Fd3m. The alkali atoms are in two unequivalent crystallographic sites, 16c and 8b. The 16c site is at the center of a slightly distorted pentagonal dodecahedron with 20 coordination; the 8b site is in a hexadecahedron of twelve pentagonal and four hexagonal faces, giving a coordination of 28. The Me-E distances are too large for any appreciable direct bonding by the alkali atoms. Therefore, the respective metal atoms may be essentially uncharged. The alkali atoms favor occupying the larger caged 8b sites. This compound is analogous to the 136 H$_2$O·8M type-II hydrate structure.

Recent calculations indicate that some clathrate compounds have indirect band gaps that are 60% larger than that of the Si diamond structure. Such clathrate compounds may provide semiconductor materials suitable for fabricating thermoelectric elements for high temperature, power generation applications. A theoretical investigation of the effects on the electronic structure due to doping Si clathrates with alkali metals has also been reported. The effect of doping on the band structure is stronger for more electronegative alkali metals. Employing the one electron model, these metals effect the lowest conduction band states.

Table I is a listing of published Sn clathrate compounds taken from available literature. The first six clathrate compounds typically have type I crystal lattice structures as represented by unit cell 50 shown in FIG. 5. The last clathrate compound ($Ba_{16} Ga_{32} Sn_{104}$) has the type II crystal lattice structure as represented by unit cell 150 of FIG. 6. The respective lattice parameters ($a_0$) are taken from available crystallographic data. The estimated radii of subcells or cages 60 and 62 has been estimated using crystallographic data. Lattice parameter($a_0$) and radii of subcells or cages 60 and 62 are expressed in angstroms (Å).

TABLE I

Crystal structure, cage coordination number, CN, estimated average cage radii, for known Sn-clathrate compounds taken from published literature.

| compounds | crystal structure | cage CN | cage radii* (Å) |
|---|---|---|---|
| $K_xSn_{25}$ (3<x<13) | $P4_132$ ($0^7$) | 20 | 2.70 |
| $Ba_6In_4Sn_{21}$ | $P4_132$ ($0^7$) | 20 | — |
| $M_8Sn_{44}$ | Pm3n ($O_h^3$) | 20 | 2.53** |
| (M = K, Cs, Rb) |  | 24 | 2.87** |
| $K_{1.6}Cs_{6.4}Sn_{44}$ | Pm3n ($O_h^3$) | 20 | 2.53 |
|  |  | 24 | 2.88 |
| $K_8A_{23}Sn_{23}$ | Pm3m ($O_h^5$) | 20 | — |
| (A = Al, Ga, In) |  | 24 |  |

TABLE I-continued

Crystal structure, cage coordination number, CN, estimated average cage radii, for known Sn-clathrate compounds taken from published literature.

| compounds | crystal structure | cage CN | cage radii* (Å) |
|---|---|---|---|
| $K_8Sn_{46}$ | Pm3m ($O_h^5$) | 20 | 2.50 |
|  |  | 24 | 2.85 |
| $Ba_{16}Ga_{32}Sn_{104}$ | Fd3m ($O_h^7$) | 20 | — |

*calculated from the x-ray crystallographic data in published references.
**calculated from data on $K_8Sn_{46}$.

Clathrate compounds having crystal lattice type structures may be doped with selected impurities to produce N-type thermoelectric elements 22a and P-type thermoelectric elements 22b. For example, adding gallium (Ga) as a doping agent to the many semiconductor materials including those listed on Table I will typically produce N-type thermoelectric elements 22a. If desired, thermoelectric device 20 may be manufactured with N-type thermoelectric elements 22a fabricated from the semiconductor materials with the type I or type II clathrate crystal lattice structure. Some clathrate compounds including several of the compounds listed in Table I may be doped with elements such as zinc (Zn) to produce P-type thermoelectric elements 22b.

As previously noted, thermal conductivity ($\kappa$) is a function of both an electrical component ($\kappa_e$) primarily associated with the respective carriers and a lattice component ($\kappa_g$) primarily associated with the respective crystal lattice structure and propagation of phonons through the crystal lattice structure. Generally, increasing atomic disorder within a crystal lattice structure will reduce phonon propagation distance to its absolute minimum value (represented by $\kappa_{min}$). However, carrier mobility is generally much higher in a perfectly ordered atomic structure with covalent bonds that substantially reduce or eliminate any scattering of the associated carriers as each carrier propagates through the respective crystal lattice structure. Clathrate compounds with crystal lattice type structures such as represented by unit cells 50 and 150 allow substantial reductions in thermal conductivity ($\kappa$) while at the same time minimizing any detrimental effects on carrier mobility or other electrical properties associated with the semiconductor materials forming the clathrate type crystal lattice structure. The value of such electrical properties may be represented as $S^2\sigma$.

Clathrate compounds and other materials that form an inclusion complex may be fabricated in accordance with teachings of the present invention by using one of the following techniques. The first employs a two zone furnace. Atoms of the first material component can be kept at a higher temperature than the temperature where the evaporated alkali metal will be collected, i.e., the sink temperature. In addition, a continuous flow of nitrogen may be used to reduce oxidation impurities as opposed to a vacuum.

Examples of previously known distillation temperatures and decomposition temperatures for some clathrate compounds satisfactory for use in forming thermoelectric elements in accordance with teachings of the present invention are shown in Table II.

TABLE II

Synthesis properties of selected Clathrate compounds.

| Structure | group IV element | alkali | x | $a_o$ (Å) | distillation temp. (° C.) | decomposition temp. (° C.) |
|---|---|---|---|---|---|---|
| $Me_xE_{46}$ | Silicon | Na | 8 | 10.19 | 430 | 450 |
|  |  | K | 7 | 10.26 | 360 | 530 |
|  |  | Rb | 5 | 10.27 | 340 | 530 |
|  | Germanium | Na | 8 | — | 325 | 400 |
|  |  | K | 8 | 10.66 | 340 | 450 |
|  |  | Rb | 5 | 10.27 | 370 | 440 |
|  | Tin | K | 8 | 12.03 | — | — |
|  |  | Rb | 8 | 12.05 | — | — |
| $Me_xE_{136}$ | Silicon | Na | 3 | 14.62 | 445 | 450 |
|  |  |  | 7 | 14.62 | 380 | 450 |
|  |  |  | 11 | 14.62 | 340 | 450 |
|  |  | $C_3$ | 7 | 14.64 | 350 | 500 |
|  | Germanium | Na | 3 | 15.40 | 360 | 400 |

The alkali concentration in the clathrates is a function of the distillation temperature. Theoretically, all the alkali metal may be removed leaving the "unfilled" host clathrate structure. This type of procedure may be employed in putting atoms other than alkali metals into the voids. Due to the fact that the clathrates are generally moisture insensitive and typically unreactive with acids, trace amounts of alkali metals may subsequently be easily removed.

The Group IV elements may be dissolved in high purity alkali metals by heating the mixture to 700° C. in a tantalum crucible contained inside a stainless steel can. The can may then be evacuated and backfilled several times with high purity nitrogen to ensure a minimum of unwanted oxygen inside. The can will preferably be welded shut with the appropriate inert gas atmosphere inside. The reaction will result in the formation of MeE together with excess alkali. The alkali metal atoms will then be removed by distillation at particular temperatures depending on selected amounts of alkali metal desired in the final clathrate compound. Once the reaction begins, forming $Me_xE_y$, the vapor pressure will subsequently decrease. The stainless steel can will contain this pressure. After the clathrate compound $Me_xE_y$ is formed any possibly elemental alkali metal can be evaporated by heating under high vacuum for a period of several days. There are also defect members of the clathrate type structure with one-third random vacancies at the 6c crystallographic positions. These are of the type $Me_8E_{44}$. One member, $Cs_8Sn_{44}$, is a semiconductor compound with relatively high S and $\rho$ valves. See FIGS. 10 and 11. In addition, these clathrates have been synthesized with more than one alkali-metal and alkali-earth inclusion atom with markedly low thermal conductivity valves (see Table III).

TABLE III

Representative type I clathrate compounds indicating the atomic percentages from electronic-beam microprobe analysis, the lattice parameters, $a_0$, the average grain size, the measured density, D, absolute Seebeck coefficient, S, and resistivity, $\rho$, at room temperature.

| compound | Elemental atomic % | $A_0$ (Å) | grain size ($\mu$m) | D g/cm$^3$ | S ($\mu$V/K) | $\rho$ (m$\Omega$-cm) |
|---|---|---|---|---|---|---|
| $Ba_8Ga_{16}Sn_{30}$ | 14.4 Ba/29.7 Ga/54.9 Sn | 11.594 | 9.0 | 5.73 | −145 | 14.9 |
| $Cs_8Sn_{44}$ | 15.6 Cs/84.4 Sn | 12.113 | 13 | 5.39 | −304 | 59.4 |
| $Rb_8Ga_8Sn_{38}$ | 14.6 Rb/14.9 Ga/70.4 Sn | 11.981 | 21 | 4.62 | −153 | 0.767 |
| $Ba_8Ga_{16}Si_{30}$ | 15.2 Ba/27.5 Ga/57.0 Si | 10.554 | 9.6 | 3.90 | −66.3 | 2.05 |
| $Sr_8Zn_8Ge_{80}$ | 17.8 Sr/40.5 Zn/41.6 Ge | 10.715 | 25 | 5.31 | +26.9 | 0.260 |
| $Sr_8Ga_{16}Ge_{30}$ | 14.5 Sr/30.2 Ga/55.3 Ge | 10.731 | 9.6 | 4.65 | −320 | 12.9 |
| $Eu_8Ga_{16}Ge_{30}$ | 14.2 Eu/28.3 Ga/57.6 Ga | 10.711 | 5.4 | 5.39 | −152 | 2.56 |
| $Sr_4Eu_4Ga_{16}Ge_{30}$ | 8.2 Sr/6.9 Eu 28.6 Ga/56.4 Ge | 10.726 | 12 | 5.57 | −88.1 | 1.02 |
| $Rb_4Cs_4Ga_8Sn_{38}$ | — | — | 12 | 4.74 | −31.5 | 6.25 |
| $Sr_8Ga_{16}Si_9Gi_{21}$ | — | — | 11 | 4.70 | −111 | 25.0 |

A direct synthesis approach was employed to prepare the samples described herein (see Table III). All alkali metal, alkaline earth and europium elements were handled in an inert atmosphere glove box. The alkali metal containing tin clathrate compounds was prepared by mixing and reacting stoichiometric quantities of the constituent elements in a tungsten crucible which was sealed inside a welded stainless steel canister. The canisters were evacuated and backfilled with argon before welding shut. They were then placed in a 550° C. furnace for a 1 to 2 week period. The Si and Ge clathrate compounds were prepared by mixing and reacting stoichiometric amounts of the constituent elements inside pyrolitic boron nitride crucibles which were themselves sealed inside quartz ampules at 950° C. for a period of 3 days to 2 weeks. The ampules were evacuated and backfilled with argon prior to heating. The compounds were subsequently ground to fine powders and densified to near their theoretical densities for metallographic and chemical analysis, and transport measurements. Densification was achieved, typically, at a sustained pressure of 25,000 lb/in$^2$ and a temperature of 380° C., for the case of the Sn clathrates, or 600° C., for the case of the Si and Ge clathrates, for two hours employing graphite die tooling.

Compounds $K_xSn_{25}$ and $Ba_6In_4Sn_{21}$ shown in Table I are defect members of the type-I hydrate, or $X_8(H_2O)_{46}$ structure with one-third vacancies in the anion positions. The next two series of compounds in Table I are of the type-I hydrate structure group however, with two anion vacancies per formula unit. These can be shown by writing the chemical formulas as $Me_8Sn_{44}\square_2$ and $K_{1.6}Cs_{6.4}Sn_{44}\square_2$ where $\square$ represents a vacant site. $K_8Sn_{46}$ and $K_8A_{23}Sn_{23}$ are the type-I hydrate type, and $Ba_{16}Ga_{32}Sn_{104}$ is of the type-II hydrate type, $X_{24}(H_2O)_{136}$. In the latter two compounds Al, Ga, and In are substitutionally placed in the Sn site in the structure. Therefore, the ions which may be trapped in these Sn-clathrate structures in accordance with teachings of the present invention thus far are known to include K, Rb, Cs, and Ba.

Table I indicates that the size of the cages in these Sn-clathrates are essentially similar to the size of the cages in clathrate hydrates, 2.51 Å. The reduction in $K_g$ is essentially proportional to the ratio of the radius of the inclusion atom to the radius of the respective cavity or cage. This reduction is also proportional to the mass of the inclusion atoms. Therefore, placing the smaller and more massive rare-earth atoms in the cavities or cages may greatly reduce $K_g$. Sn-clathrates may be non-metallic if the proper electron count is established. This has been observed in Ge-clathrates where some Cd, In, or Zn was substituted for Ge in order to charge compensate for the Ba in the cages of the structure.

An estimate of the minimum thermal conductivity, $K_{min}$, for gray-Sn (i.e. Sn in the diamond structure) at room temperature may be estimated as follows. The K of amorphous Ge is approximately equal to 0.5 Wm$^{-1}$K$^{-1}$, [17] while the Debye temperature, $\Theta_D$, for Ge is 374K. $\Theta_D$ for gray-Sn is 220 K. Since $K_{min} \Theta_D$, a reasonable estimate for the value of $K_{min}$ for gray-Sn is approximately 0.3 Wm$^{-1}$K$_{-1}$. Using this result and literature values in calculating $S^2\sigma$ as a function of charge carrier concentration for GaAs, a reasonable estimate for the minimum enhancement in the Figure of Merit, (ZT), as a function of carrier concentration for these clathrate compounds at room temperature is shown in FIG. 4. This shows the minimum potential for clathrate compounds formed in accordance with teachings of the present invention. Improved values compared to those shown in FIG. 4 may be realized when the mobilities in the clathrate compounds are optimized.

Figure 8:
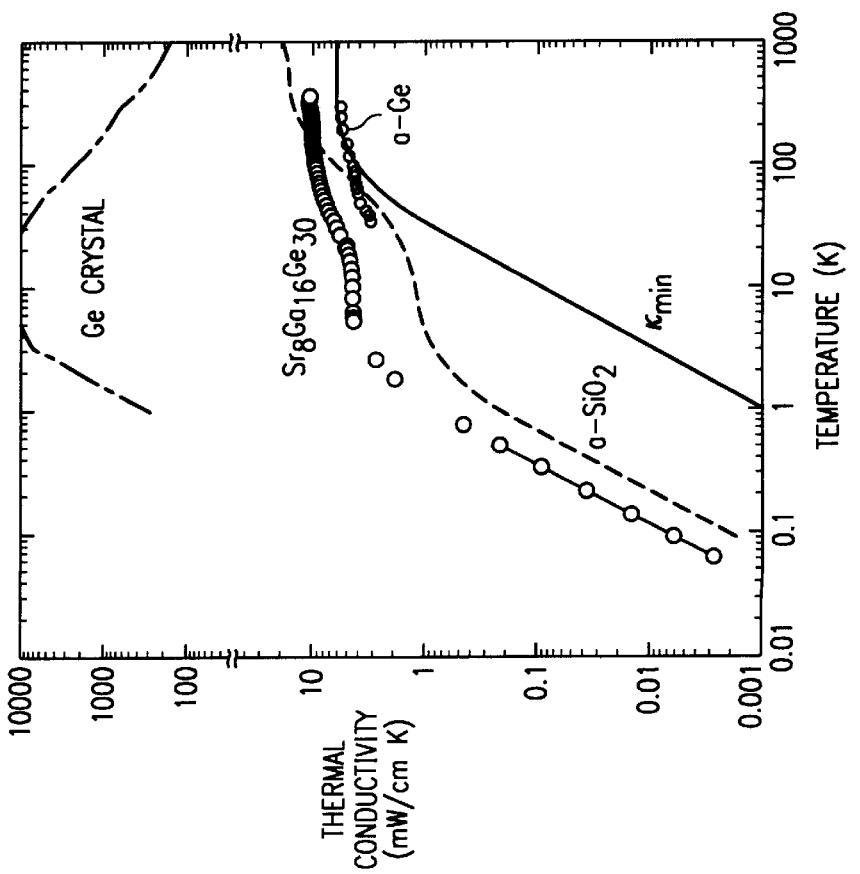
FIG. 8 is a graphical representation of thermal conductivity versus absolute temperature for various materials including a clathrate compound having the general formula $Sr_8Ga_{16}Ge_{30}$ formed in accordance with teachings of the present invention.

Thermal transport and thermopower (S) measurements were carried out by the two-thermocouple, steady state heat-flow technique. Due to the very low $\kappa$ of these samples, the losses due to radiation and conduction through the wires was measured and corrected for. These corrections were 15% near room temperature and <5% for temperatures below 120 K. The samples were cut into parallel faced parallelepipeds. The heat flow was measured along the longest axis. Since the clathrate compounds are cubic, $\kappa_g$ is isotropic. FIG. 8 shows $\kappa_g$ as a function of temperature for $Sr_8Ga_{16}Ge_{30}$ along with $\kappa$ for amorphous germanium (a-Ge), amorphous glass (a-SiO$_2$) and the calculated minimum thermal conductivity $\kappa_{min}$ for Ge.

From FIG. 8 several interesting results are apparent. The magnitude of $\kappa_g$ of $Sr_8Ga_{16}Ge_{30}$ is over an order-of-magnitude lower than that of crystalline germanium in the measured temperature range. The low temperature (<1 K) measurement indicates a T$^2$ temperature dependence. This is not the normal crystalline T$^3$ dependence but is similar to the T$^\alpha$ temperature dependence (with $\alpha$-2) for amorphous compounds and to the T$^2$-dependence calculated for $\kappa_{min}$ at low temperatures. From FIG. 8 it is clear that a crystalline material with glass-like thermal transport properties has been synthesized in accordance with teachings of the present invention.

Figure 9:
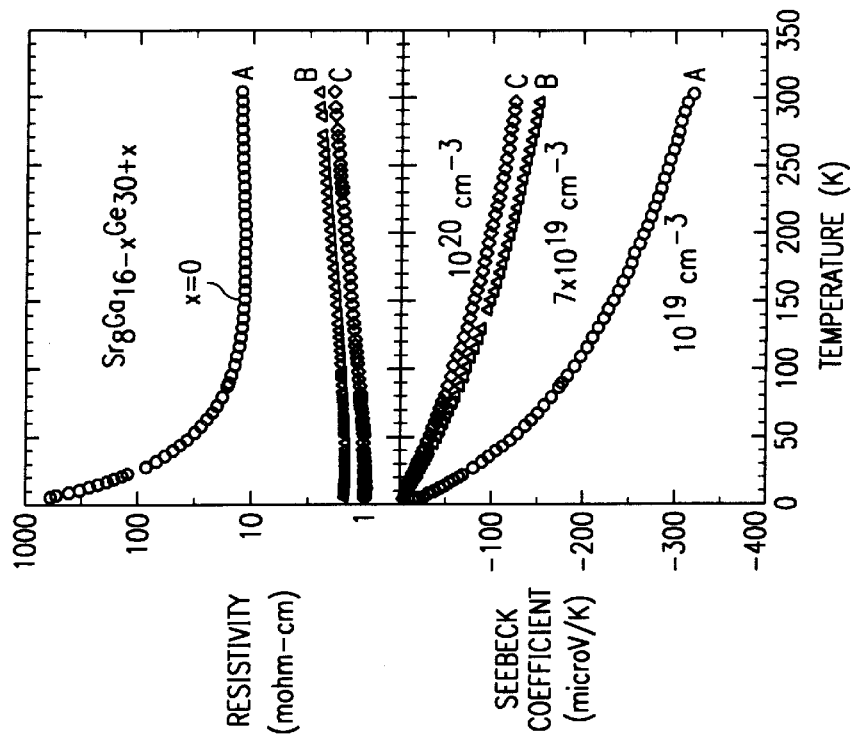
FIG. 9 shows respective graphical representation of electrical resistivity ($\rho$) and Seebeck coefficient (S) versus absolute temperature for three clathrate compounds having the general formula $Sr_8Ga_{16-x}Ge_{30+x}$ formed in accordance with teachings of the present invention.

FIG. 9 shows values of ρ and absolute S as functions of temperature from 300 K to 5 K of three clathrate compounds having the general formula $Sr_8Ga_{16-x}Ge_{30-x}$ designated A, B and C. Table IV lists relevant physical properties of these compounds A, B and C. Also, the Hall carrier concentration at room temperature for these three samples is shown in FIG. 9 and Table IV.

TABLE IV

Three $Sr_8Ga_{16}Ge_{30}$ samples indicating the atomic percentages from electron microprobe analysis, the lattice parameter in Å, $a_o$, the measured percent of theoretical density, average grain size in microns, the measured carrier concentration in $cm^{-3}$, $n_o$, and mobility in $cm^2/Vsec$, $\mu$, at room temperature. The estimated theoretical atomic percentages in the stoichiometric compound are 14.8% Sr, 29.63% Ga, and 55.56% Ge.

| Sample | At %; Sr, Ga, Ge | $a_o$ | D | grain size | $n_o$ | $\mu$ |
|---|---|---|---|---|---|---|
| A | 14.8, 30.2, 55.3 | 10.731 ± 0.011 | 87 | 9.6 | $10^{19}$ | 30 |
| B | 14.7, 29.8, 55.5 | 10.732 ± 0.006 | 96 | 17.4 | $7 \times 10^{19}$ | 29 |
| C | 14.6, 28.5, 56.9 | 10.739 ± 0.005 | 93 | 10.7 | $10^{20}$ | 17 |

The value of absolute S decreases with decreasing temperature, as expected in heavily-doped semiconductors with negligible phonon drag. The carrier concentrations were taken from Hall coefficient measurements using the ven der Pauw technique and were conducted at room temperature. The higher (lower) the carrier concentration in these N-type samples, the lower (higher) the values of ρ and S, as typical of semiconductor materials. As seen in FIG. 9 and Table IV, the present invention allows varying the electronic properties of these N-type samples by varying the Ga-to-Ge ratio. The Ga appears to randomly substitute for Ge in the structure and is used to produce charge compensation for the divalent alkali-earth ion $Sr^{2+}$. This means that two Ga atoms act as "acceptors" for the two "donated" electrons from each $Sr^{2+}$ ion. The stoichiometric semiconducting compound should have 46×4=184 bonding electrons per formula unit.

Figure 10:
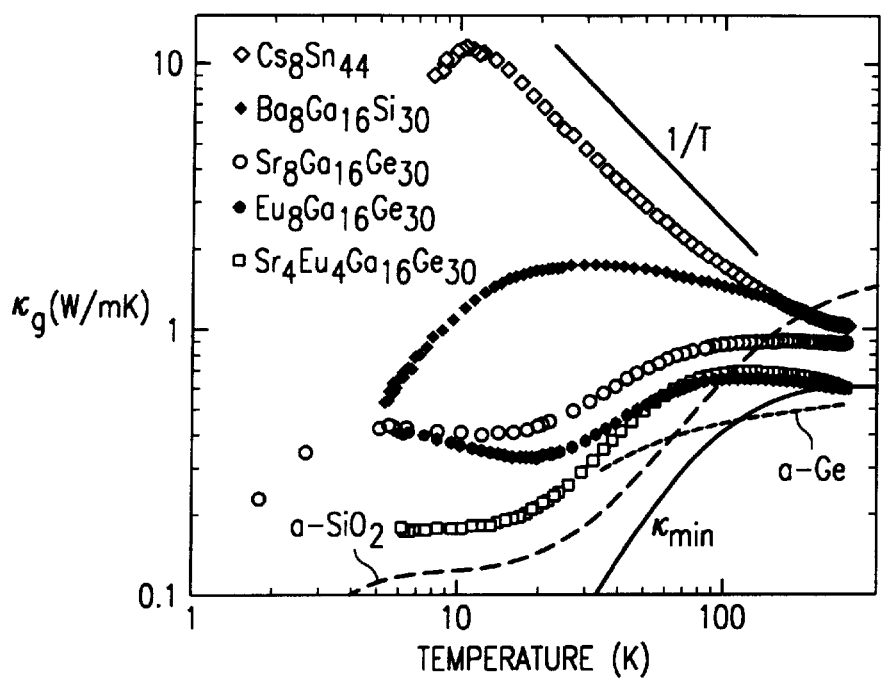
FIG. 10 is a graphical representation of lattice component of thermal conductivity ($\kappa_g$) versus absolute temperature for five representative clathrate compounds formed in accordance with teachings of the present invention along with data for a-SiO$_2$, a-Ge and $\kappa_{min}$ for Ge.

FIG. 10 shows the lattice thermal conductivity, $k_g$, in the temperature range from 300 to 6 K for five representative clathrate samples from Table III. Also shown is K for a-Ge, a-$SiO_2$ and $K_{min}$ for Ge. As seen in FIG. 10 the Ge-clathrates have characteristics much like that of a-$SiO_2$. In the $Sr_4Eu_4Ga_{16}Ge_{30}$ sample there are two atoms in the voids of the crystal structure which introduces an even greater disorder. This compound exhibits the lowest $K_g$ values in the temperature range shown and the most "glass-like" temperature dependence of $K_g$. The $Ba_8Ga_{16}Si_{30}$ sample has a rather low $K_g$ (lower than $K_{min}$=1.2 W/mK at room temperature for Si) however it's temperature dependence is more typical of a crystalline solid. In the case of $Cs_8Sn_{44}$, $K_g$ has a temperature dependence typical of crystalline materials (a $T^{-1}$ temperature dependence as shown in FIG. 10) although the magnitude of $K_g$ is also rather low. This temperature dependence may be because the $Cs^+$ ion is not as free to "rattle" in the cages of this compound as in the cage of the other clathrates. This may be due to the fact that there are two Sn vacancies in the Sn-matrix with a resulting effect on the size and shape of the cages encapsulating the $Cs^+$ ions.

The radii of the $Ba^{2+}$, $Eu^{2+}$0 and $Sr^{2+}$ ions are 2.07, 1.91 and 1.90 Å, respectively, from x-ray crystallographic data of the respective telluride compounds with the NaCl-type structure. These ion dimensions may not be accurate for these ions in the Si or Ge-clathrates where they are in polyhedra having large, 20 and 24, CN values, however, the trend in sizes should be similar. The diameter of $Ba^{2+}$ is most likely slightly larger in size than the radius of the smaller $Si_{20}$ cage and approximately equal to that of the $Si_{24}$ cage. The $Si_{20}$ and $Si_{24}$ cage radii are estimated to be 2.05 and 2.23 Å, respectively, from x-ray diffraction data on alkali metal filled Si-clathrates. Although Ba is much more massive than the elements that make up the host matrix (i.e. Ga or Si), a prerequisite for glass-like $K_g$, the temperature dependence of $K_g$ is not similar to that of the Ge-clathrates. This is due to the fact that $Ba^{2+}$ is similar in size to $Si_{20}$ and $Si_{24}$ cages. From x-ray diffraction data, it does not appear that Ga increases the average size of the cages very much, if at all.

From Riedvelt analysis of the x-ray diffraction data (see FIG. 7) on $Sr_8Ga_{16}Ge_{30}$ samples, the $Ge_{20}$ and $Ge_{24}$ cages are 2.16 and 2.32 Å in radius, respectively. These values are slightly higher than those obtained for alkali metal Ge-clathrates. Assuming these cage sizes do not change substantially for Eu filling, the $Sr^{2+}$ and $Eu^{2+}$ ions have much more room to "rattle" in the voids of the Ge-clathrate than $Ba^{2+}$ in the Si-clathrate. The result is a much larger disorder in the Ge-clathrates, even though $Ba^{2+}$ is the more massive ion. The interaction between the guest ions and the host lattice forming the relatively large cages creates disorder due to the fact that the guest ions are entrapped in oversized cages.

Apparently these ions resonantly scatter phonons via localized low-frequency vibrations. This "rattling" of the trapped atoms in their oversized cages creates a marked reduction in $K_g$. In addition, to this dynamic disorder, a static disorder may also result from a possible random displacement of these ions from the center of the 20 and 24 CN polyhedra. In both cases, the smaller and more massive ion in a particular cage, the larger the reduction in $K_g$. This effect is similar to that observed in the skutterudite system where $K_g$ decreases as the size (mass) of the trivalent lanthanide ions interstitially placed in the cage of this crystal structure decreases (increases). In the present case, however, the disorder results in a glass-like value for $K_g$. $Eu^{2+}$ ions are almost twice the mass of $Sr^{2+}$ ions although they are approximately equal in radius. The $Eu_8Ga_{16}Ge_{30}$ compound therefore has a lower thermal conductivity than that of the $Sr_8Ga_{16}Ge_{30}$ sample. The largest disorder results from placing both $Sr^{2+}$ and $Eu^{2+}$ in the voids of the Ge-clathrate.

Figure 11:
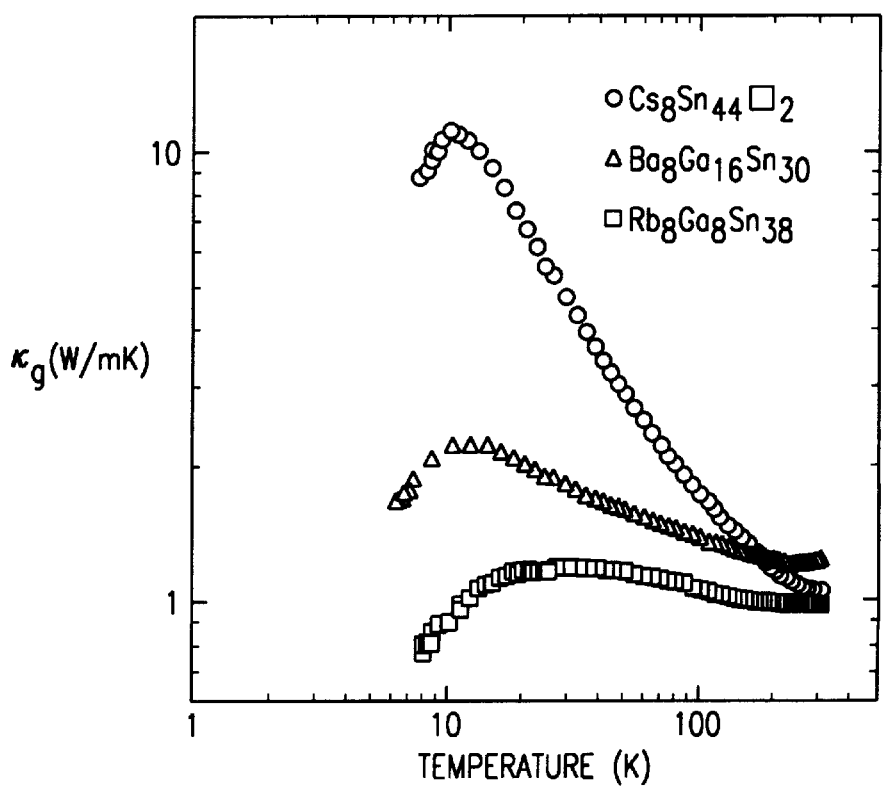
FIG. 11 is a graphical representation of lattice component of thermal conductivity versus temperature for three representative Sn-clathrate compounds formed in accordance with teachings of the present invention.

FIG. 11 shows values of $K_g$ as a function of absolute temperature for two SN-clathrate compounds plus the $Cs_8Sn_{44}$ compound shown in FIG. 10. The $Rb_8Ga_8Sn_{38}$ clathrate compound has very low values of $K_g$ in the temperature range shown. In addition, its temperature dependence is atypical of a crystalline material. The $Rb^+$ ion is smaller than the $Cs^+$ ion and therefore may "rattle" more inside it's case of Sn atoms. The $Ba_8Ga_{16}Sn_{30}$ forms a clathrate-type structure which contains only one type of cage, as opposed to the two different cages in the type-I and II clathrate hydrates. This compound has space group I43m and also has a relatively low $K_g$ however its temperature dependence indicates that some characteristics of a crystalline solid remain.

Figure 12:
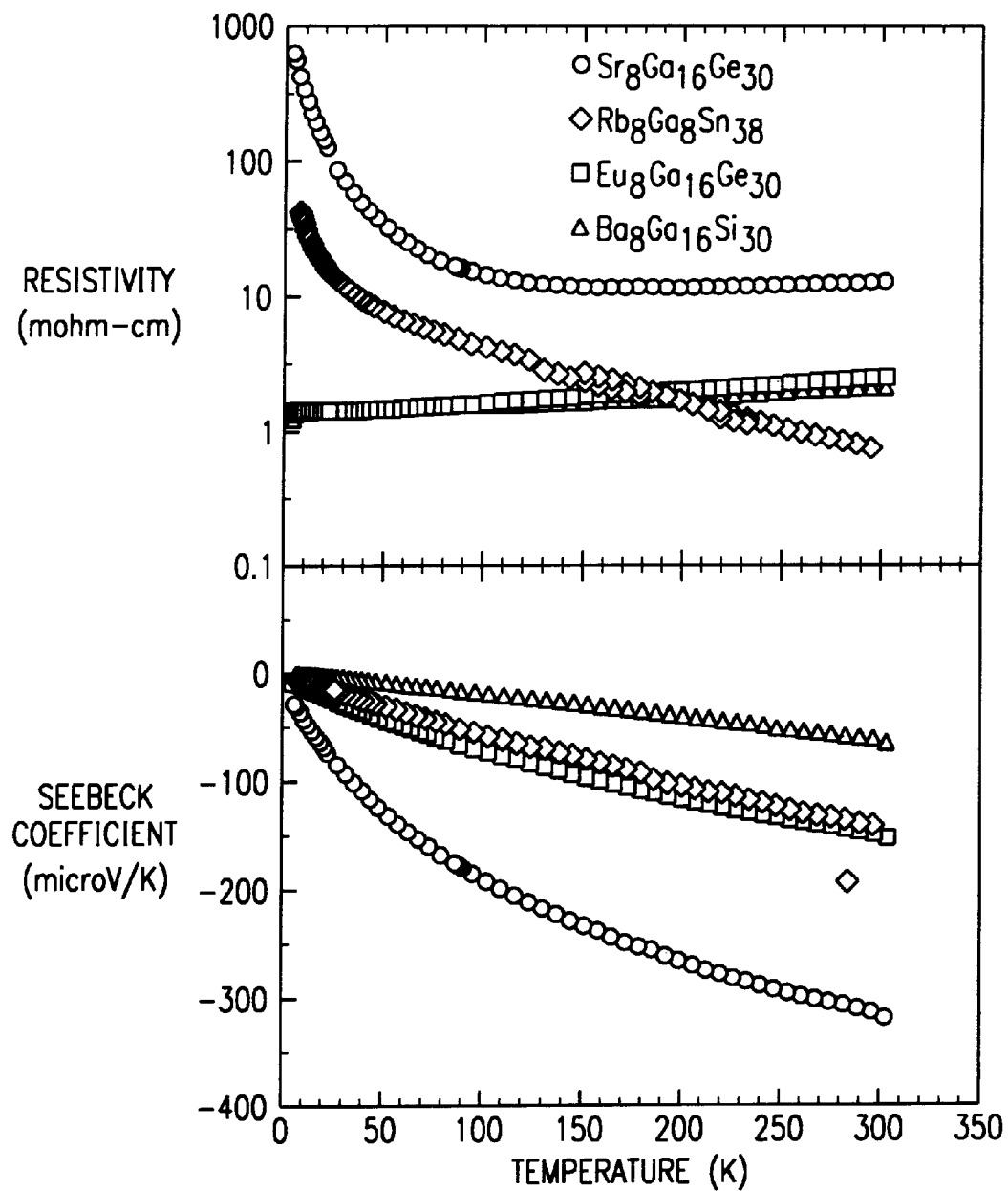
FIG. 12 shows respective graphical representation of electrical resistivity P and Seebeck coefficient (S) as a function of absolute temperature for N-type clathrate $Sr_8Ga_{16}Ge_{30}$, $Rb_8Ga_8Sn_{38}$, $Eu_8Ga_{16}Ge_{30}$ and $Ba8Ga_{16}Si_{30}$.

The values of S and ρ of four representative clathrate compounds with the type I hydrate structure are shown in FIG. 12. The thermopower decreases with increasing temperature, typical of semiconductor behavior, with the amplitude dependent on the carrier concentration. The ρ of $Ba_8Ga_{16}Si_{30}$ and $Eu_8Ga_{16}Ge_{30}$ decreases slightly with the decreasing temperature, typical of semiconductors with high dopant concentrations. For the case of $Sr_8Ga_{16}Ge_{30}$ and $Rb_8Ga_8Sn_{39}$ a semiconducting temperature dependence is observed.

For the three samples in Table IV, ZT≈0.25 at 300 K. The room temperature ZT value is even higher for the $Eu_8Ga_{16}Ge_{30}$ sample. These results were confirmed by measurements on a standard Z-meter used for testing thermoelectric materials. These results are quite remarkable and represents a high ZT value at room temperature for these unoptimized materials. Employing FIG. 9 and the carrier concentration values in Table IV, an estimate of the electron effective mass can be made in a straightforward fashion using Fermi statistics and assuming acoustic phonon scattering in a single-band model. Using these results and assuming a single band model with predominantly acoustic phonon scattering, the present invention provides an estimate of the high temperature transport properties. This estimate may be used to obtain ZT≧2 for temperatures of T>700K for these samples. This prediction represents a larger ZT than found for PbTe-based thermoelectric materials. The ZT values could presumably be increased by optimizing the doping level in accordance with teachings of the present invention.

Although the present invention has been described in detail, it should be understood that various changes, substitutions and alterations can be made herein without departing from the spirit and the scope of the invention as defined in the following claims.

APPENDIX

DEFINITIONS AND EXPLANATION OF SYMBOLS

| | |
|---|---|
| Thermoelectric Figure of Merit | ZT |
| Absolute Temperature | T |
| Seebeck coefficient | S |
| Electrical Conductivity | σ |
| Electrical Resistivity | ρ |
| Electrical Properties of Materials Used to Form Thermoelectric Elements | $S^2\sigma$ |
| Thermal Conductivity | κ |
| Electronic Component of Thermal Conductivity | $\kappa_e$ |
| Lattice Component of Thermal Conductivity | $\kappa_g$ |
| Angstrom | Å |
| Metal Atom | Me, Ne, Y, Z |
| Semi-metal or Nonmetal Atom | E |
| ELEMENTS | SYMBOL |
| Antimony | Sb |
| Arsenic | As |
| Barium | Ba |
| Cadmium | Cd |
| Calcium | Ca |
| Cesium | Cs |
| Europium | Eu |
| Gallium | Ga |
| Germanium | Ge |
| Indium | In |
| Phosphorous | P |
| Potassium | K |
| Rubidium | Rb |
| Selenium | Se |
| Silicon | Si |
| Sodium | Na |
| Strontium | Sr |
| Tellurium | Te |
| Tin | Sn |
| Xenon | Xe |
| Zinc | Zn |

What is claimed is:

1. A thermoelectric device having at least one thermoelectric element formed in part from an inclusion complex having a first material component and a second material component which cooperate with each other to form a crystal lattice structure comprising:

a unit cell formed from atoms of the first material component having at least two cavities sized to respectively receive an atom of the second material component therein;

the atoms of the first material component different from the atoms of the second material component; and the atoms of the second material component disposed within the respective cavities without forming a metallurgical bond with adjacent atoms of the first material component.

2. The thermoelectric device of claim 1 wherein the atoms of the second material component comprise at least three percent of the total mass of each unit cell.

3. The thermoelectric device of claim 1 wherein the first material component comprises atoms selected from the group consisting of aluminum, silicon, germanium, tin, gallium, indium, phosphorous, arsenic, antimony, tellurium, zinc and cadmium.

4. The thermoelectric device of claim 1 wherein the second material component comprises atoms selected from the group consisting of potassium, sodium, calcium, strontium, barium, europium, cesium and rubidium.

5. The thermoelectric device of claim 1 wherein the crystal lattice structure further comprises:

a large number of unit cells;

the second material component comprising a first group of inclusion atoms disposed within a selected number of the cavities without forming a metallurgical bond with adjacent atoms of the first material component;

the second material component further comprises a second group of inclusion atoms disposed within a selected number of the cavities without forming a metallurgical bond with the adjacent atoms of the first material; and the first group of inclusion atoms are different from the second group of inclusion atoms.

6. The thermoelectric device of claim 1 wherein the inclusion complex comprises a clathrate compound having a general formula selected from the group consisting of $Cs_8Sn_{46}$; $Cs_8Sn_{44}$; $Ba_8Ga_{16}Si_{30}$; $Sr_8Ga_{16}Ge_{30}$; $Eu_8Ga_{16}Ge_{30}$; $Sr_4Eu_4Ga_{16}Ge_{30}$; $Ba_8Ga_{16}Sn_{30}$; $Sr_8Zn_8Ge_{38}$; $Rb_8Ga_8Sn_{38}$ and $Rb_4Cs_4Ga_8Sn_{38}$.

7. The thermoelectric device as defined in claim 1 wherein the inclusion complex material comprises:

a clathrate compound having a general formula selected from the group consisting of $M_xE_{46}$ or $M_xE_{136}$;

M selected from the group consisting of alkali metal atoms, alkaline earth atoms and europium;

E selected from the group consisting of germanium, silicon and tin; and the value of X selected to be equal to or greater than three and less than or equal to twenty four.

8. The thermoelectric device of claim 1 wherein the inclusion complex further comprises a type I clathrate compound.

9. The thermoelectric device of claim 1 wherein the inclusion complex further comprises a type I clathrate compound having at least one void cavity.

10. The thermoelectric device of claim 1 wherein the inclusion complex further comprises a type II clathrate compound.

11. The thermoelectric device of claim 1 wherein the inclusion complex further comprises a type II clathrate compound having at least one void cavity.

12. The thermoelectric device of claim 1 wherein the inclusion complex further comprises a clathrate compound with the unit cell having two vacant crystallographic sites associated with atoms of the first material component.

13. A thermoelectric device having at least one thermoelectric element formed in part from a clathrate compound having a crystal lattice structure comprising:

a unit cell formed from atoms of a first material component having at least two cavities formed within the unit cell and sized to receive an atom of a second material component which is different from the atoms of the first material component;

one atom of the second material component disposed within each of the cavities without forming a metallurgical bond with the atoms of the first material component; and the unit cell has the general configuration of a clathrate hydrate.

14. The thermoelectric device of claim 13 wherein the atoms of the second material component comprise at least three percent of the total mass of each unit cell.

15. The thermoelectric device of claim 13 wherein the atoms of the first material component comprises atoms selected from the group consisting of aluminum, silicon, germanium, tin, gallium, indium, phosphorous, arsenic, antimony, tellurium, zinc and cadmium.

16. The thermoelectric device of claim 13 wherein the atoms of the second material component are selected from the Na, K, Rb, Cs, Ca, Sr, Ba or Eu.

17. The thermoelectric device of claim 13 further comprising the clathrate compound having a general formula $M_xE_{136}$ where M is selected from the group consisting of Na, K, Rb, Cs, Ca, Sr, Ba or Eu and E is selected from the group consisting of P, As, Sb, Te, Ge, Si, Sn, Zn or Cd with $3 \leq x \leq 24$.

18. The thermoelectric device of claim 13 further comprising:

the clathrate compound having a general formula $M_xE_{136}$;

M selected from the group consisting of Na, K, Rb, Cs, A, Sr, Ba or Eu;

E selected from the group consisting of P, As, Sb, Te, Ge, Si, Sn, Zn, or Cd with $3 \leq x \leq 24$; and portions of the clathrate compound formed with selected vacancies at respective crystallographic sites associated with E atoms.

19. The thermoelectric device of claim 13 wherein the clathrate compound comprises the general formula $M_8E_{46}$ with M selected from the group consisting of Na, K, Rb, Cs, Ca, Sr, Ba or Eu and E selected from the group consisting of Ge, Si, Sn, Zn, Cd, P, As, Sb or Te.

20. The thermoelectric device of claim 13 further comprising;

the clathrate compound having the general formula $M_8E_{46}$;

M selected from the group consisting of Na, K, Rb, Cs, Ca, Sr, Ba, or Eu;

E selected form the group consisting of Ge, Si, Sn, Zn, Cd, P, As, Sb or Te; and portions of the clathrate compound formed with selected vacancies at respective crystallographic sites associated with E atoms.

21. A thermoelectric device comprising at least one thermoelectric element formed in part from a clathrate compound having a general formula selected from the group consisting of $Ne_8Y_{16}E_{30}$, $Me_8Y_8E_{38}$ or $Me_8E_{46}$, $Me_{24}E_{136}$ and alloys of these compounds where Me represents alkali metal atoms, Ne represents atoms selected from alkaline earth, and Y represents atoms selected from group 13 atoms and E represents group 14 atoms.

22. A thermoelectric device comprising:

at least one thermoelectric element formed in part from a clathrate compound having a general formula selected from the group consisting of $M_8Si_yGe_{46-y}$, $M_8Si_ySn_{46-y}$, $M_8Ge_ySi_{46-y}$, $M_8Ge_ySn_{t-y}$, $M_8Sn_yGe_{46-y}$, or $M_8Sn_ySi_{46-y}$ and alloys of these compounds;

where M represents alkali metal atoms, alkaline earth atoms, and europium; and $0 \leq y \leq 46$.

23. The thermoelectric of claim 22 further comprising the clathrate compound having a unit cell defined in part by forty-six crystallographic sites of which forty-four crystallographic sites are filled with atoms selected from the group consisting of Sn, Si or Ge and two of the crystallographic sites are vacant.

24. A thermoelectric device having at least one thermoelectric element formed in part from an inclusion complex having a first material component and a second material component which cooperate with each other to form a cystal lattice structure comprising:

a unit cell formed from atoms of the first material component having at least two cavities sized to respectively receive an atom of the second material component therein;

the atoms of the fist material component different from the second material component;

the atoms of the second material component disposed with the respectie cavities without forming a metallurgical bond with adjacent atoms of the first material component; and wherein the inclusion complex material comprises a clathrate compound having a general formula of $Sr_8Ga_{16}Si_9Ge_{21}$.

25. A thermoelectric device having at least one thermoelectric element form in part from an inclusion complex having a first material component and a second material component which cooperate with each other to form a crystal lattice structure comprising:

a unit cell formed from atoms of the first material component having at least two cavities sized to respectively receive an atom of the second material component therein;

the atoms of the first material component different from the second material component;

the atoms of the second material component disposed within the respective cavities without forming a metallurgical bond with adjacent atoms of the first material component; and wherein the inclusion complex material comprises a clathrate compound having a general formula of $Sr_8Ga_{16-x}Ge_{30+x}$ where $0 \leq x \leq 16$.

26. A thermoelectric device having at least one thermoelectric element formed in part from a clathrate compound having a crystal lattice structure comprising:

a unit cell formed from atom of a first material compoent having at least two cavities formed witbin the unit cell and sized to receive an atom of a second material component which is different from the atoms of the first material component;

one atom of the secoud material component disposed within each of the cavities without forming a metallurgical bond with the atoms of the first material component;

the unit cell having the configuration of a clathrate hydrate; and the clathrate conmpound having a general formula of $Sr_{B-y}Ga_{16-x}Ge_{30+x}$.

* * * * *

UNITED STATES PATENT AND TRADEMARK OFFICE
CERTIFICATE OF CORRECTION

PATENT NO. : 6,188,011 B1
DATED : February 13, 2001
INVENTOR(S) : George S. Nolas et al.

It is certified that error appears in the above-identified patent and that said Letters Patent is hereby corrected as shown below:

Column 2,
Line 19, delete "$K=ek_e + K_g$", and insert -- $K= K_e + K_g$ --.

Column 14,
Line 22, delete "$C_3$", and insert -- $C_s$ --.

Column 16,
Line 33, after "Since," delete "$K_{min} \theta_D,$" and insert -- $K_{min} \propto \theta_D$, --.
Line 34, after "approximately", delete "$0.3\ Wm^{-1} K_{-1}$.", and insert -- $0.3\ Wm^{-1} K^{-1}$. --.
Line 62, after "dependence", delete "(with $\alpha$-2)", and insert -- (with $\alpha=2$) --.

Column 17,
Line 62, after "$Ba^{2+}$,", delete "$Eu^{2+} 0$", and insert -- $Eu^{2+}$ --.

Column 18,
Line 45, after "two", delete "SN-clathrate", and insert -- Sn-clathrate --.
Line 66, delete "$Rb_8Ga_8Sn_{39}$", and insert -- $Rb_8Ga_8Sn_{38}$ --.

Column 19,
Line 14, after "obtain", delete "$ZT \geq 2$", and insert -- $ZT \geq 1$ --.

Column 22, claim 22,
Line 2, after "$M_8Ge_y Si_{46-y}$,", delete "$M_8Ge_y Sn_{\#y}$,", and insert -- $M_8Ge_ySn_{46-y}$ --.

Column 22, claim 26,
Line 65, delete "$Sr_{8-y}Ga_{16-x}Ge_{30+x}$", and insert -- $Sr_{8-y}Ga_{16-x}Ge_{30+x}$. --.

Signed and Sealed this

First Day of January, 2002

Attest:

JAMES E. ROGAN
*Attesting Officer*     *Director of the United States Patent and Trademark Office*